US 6,775,314 B1

(12) United States Patent
Waldrip et al.

(10) Patent No.: US 6,775,314 B1
(45) Date of Patent: Aug. 10, 2004

(54) DISTRIBUTED BRAGG REFLECTOR USING AlGAN/GAN

(75) Inventors: Karen E. Waldrip, Albuquerque, NM (US); Stephen R. Lee, Albuquerque, NM (US); Jung Han, Woodbridge, CT (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/998,114

(22) Filed: Nov. 29, 2001

(51) Int. Cl.$^7$ .............................................. H01S 3/082
(52) U.S. Cl. .................................... 372/96; 372/43
(58) Field of Search ........................... 372/45, 50, 54, 372/75, 6, 39, 40, 43, 96, 9, 99

(56) References Cited

U.S. PATENT DOCUMENTS

| | | | | |
|---|---|---|---|---|
| 4,205,329 A | * | 5/1980 | Dingle et al. ................. | 257/17 |
| 4,261,771 A | * | 4/1981 | Dingle et al. ................. | 117/105 |
| 5,838,707 A | * | 11/1998 | Ramdani et al. ............... | 372/45 |
| 5,985,687 A | * | 11/1999 | Bowers et al. ................. | 438/46 |
| 6,194,744 B1 | * | 2/2001 | Udagawa et al. .............. | 257/94 |
| 6,229,834 B1 | * | 5/2001 | Nisitani et al. ................. | 372/45 |
| 6,285,698 B1 | * | 9/2001 | Romano et al. ............... | 372/46 |
| 6,306,672 B1 | * | 10/2001 | Kim .............................. | 438/22 |
| 6,562,207 B1 | * | 5/2003 | Kano et al. .................... | 257/15 |
| 6,576,932 B2 | * | 6/2003 | Khare et al. ................... | 257/103 |
| 2001/0035531 A1 | * | 11/2001 | Kano et al. .................... | 257/96 |
| 2001/0048112 A1 | * | 12/2001 | Koide et al. ................... | 257/94 |
| 2002/0036295 A1 | * | 3/2002 | Nunoue et al. ................ | 257/98 |
| 2003/0123829 A1 | * | 7/2003 | Taylor .......................... | 385/131 |

OTHER PUBLICATIONS

Waldrip, K. Han., J., Figiel, J., Zhou, H., Makarona, E., and Nurmikko, A., "Stress engineering during metalorganic chemical vapor deposition of AlGaN/GaN distributed Bragg reflectors," Appl. Phys. Lett., 2001, 78, 21, 3205–3207.

Ng, H., Moustakas, T., and Chu, S., "High reflectivity and broad bandwidth AlN/GaN distributed Bragg reflectors grown by molecular–beam epitaxy," Appl. Phys. Lett., 2000, 76, 20, 2818–2820.

Kerstnikov, I., Lundin, W., Sakharov, A., Semenov, V., Usikov, A., Tsatsul'nikov, A., and Alferov, Zh., Ledentsov, N., Hoffmann, A., and Bimberg, D., "Room–temperature photopumped inGaN/GaN/AlGaN vertical–cavity surface–emitting laser," Appl. Phys. Lett., 1999, 75, 9, 1192–1194.

Langer, R., Barski, A., Simon, J., Pelekanos, N. Konovalov, O., Andre, R., and Dang, L., "High reflectivity GaN/GaAlN Bragg mirrors at blue/green wavelengths grown by molecular beam epitaxy," Appl. Phys. Lett., 1999, 74, 24, 3610–3612.

Zhou, H., Diagne, M., Makarona, E., Nurmikko, A., Han, J., Waldrip, K., Figiel, J., "Near ultraviolet optically pumped vertical cavity laser," Elec. Lett., 2000, 36, 21.

Someya, T., and Arakawa, Y., "Highly reflective GaN/$Al_{0.34}Ga_{0.66}N$ quarter–wave reflectors grown by metal organic chemical vapor deposition," Appl. Phys. Lett., 1998, 73, 25, 3653–3655.

(List continued on next page.)

Primary Examiner—Don Wong
Assistant Examiner—Tuan N. Nguyen
(74) Attorney, Agent, or Firm—Elmer A Klavetter; Carol I Ashby

(57) ABSTRACT

A supported distributed Bragg reflector or superlattice structure formed from a substrate, a nucleation layer deposited on the substrate, and an interlayer deposited on the nucleation layer, followed by deposition of (Al,Ga,B)N layers or multiple pairs of (Al,Ga,B)N/(Al,Ga,B)N layers, where the interlayer is a material selected from AlN, $Al_xGa_{1-x}N$, and AlBN with a thickness of approximately 20 to 1000 angstroms. The interlayer functions to reduce or eliminate the initial tensile growth stress, thereby reducing cracking in the structure. Multiple interlayers utilized in an AlGaN/GaN DBR structure can eliminate cracking and produce a structure with a reflectivity value greater than 0.99.

14 Claims, 8 Drawing Sheets

OTHER PUBLICATIONS

Benamara, M., Liliental–Weber, Z., Kellermann, S., Swider, W., Washburn, J., Mazur, J., and Bourret–Courchesne, E., "Study of high–quality GaN grown by OMVPE using an intermediate layer," J. Crys. Growth, 2000, 218, 447–450.

Amano, H., Iwaya, M., Hayashi, N., Kashima, T., Katsuragawa, M., Takeuchi, T., Wetzel, C. and Akasaki, I., "Improvement of crystalline quality of group III nitrides on sapphire using low temperature interlayers," MRS Internet J. Nitr. Semicond. Res. 4S1, 1999, G10.1.

* cited by examiner

DISTRIBUTED BRAGG REFLECTOR USING AlGAN/GAN

This invention was made with Government support under Contract No. DE-AC04-94AL85000 awarded by the Department of Energy. The Government has certain rights in the invention.

BACKGROUND OF THE INVENTION

The invention describes a Distributed Bragg Reflector and method for making utilizing multiple layers of AlGaN/GaN and, more particularly, utilizing an interlayer to achieve sufficient reflectivity for a vertical cavity laser.

The growth of epitaxial distributed Bragg reflectors (DBRs) with high crystalline quality is important in the successful development of infrared and red vertical-cavity surface-emitting lasers (VCSELs). The development of III-Nitride-based VCSELs for short-wavelength (visible and ultraviolet) applications requires the preparation of crack-free, highly reflective (that is, high R) (Al,Ga)N/GaN DBRs. Difficulties arise in the preparation of crack-free highly reflective (Al,Ga)N/GaN DBRs owing to the large lattice mismatch between GaN and AlN (approximately 2.4%).

Because multiple passes of optical waves are required in VCSELs due to a short cavity (gain) length, highly reflective mirrors (typically R>99%) are required for low threshold operation. The low contrast in index of refraction between AlN and GaN (and thus the ternary alloys) necessitates the use of a large number of pairs of mirrors to achieve such reflectivities. Someya and Arakawa (Someya, T., and Arakawa, Y., Appl. Phys. Lett., 1998, 73, 3653–3655) reported the crack-free growth of a 35-pair $Al_{0.34}Ga_{0.66}N$/GaN DBR with reflectivity up to 96% at 390 nm. It was emphasized in that work that the thickness of the (high temperature-grown) GaN layer must be restricted to 0.4 $\mu$m or less to avoid sample cracking. Langer et al. (Langer, R., Barski, A., Simon, J., Pelekanos, N. T., Konovalov, O., Andre, R., and Dang, L. S., Appl. Phys. Lett., 1999, 74, 3610–3612) reported a maximum reflectivity of 93% at 473 nm with 30 pairs of $Al_{0.4}Ga_{0.59}N$/GaN DBRs. Krestnikov et al. (Krestnikov, I., Lundin, W., Sakharov, A., Semenov, V., Usikov, A., Tsatsul'nikov, A., Alferov, Zh., Ledentsov, N., Hoffman, A., and Bimberg, D., Appl. Phys. Lett., 1999, 75, 1192–1194) employed a 1.1 $\mu$m $Al_{0.08}Ga_{0.92}N$ template on sapphire for stress compensation and showed a reflectivity of 96% at 401 nm with 37 pairs of $Al_{0.15}Ga_{0.085}N$/GaN DBR mirrors. More recently, Ng et al. (Ng. H., Moustakas, T., and Chu, S., Appl. Phys. Lett., 2000, 76, 2818–2820) explored DBR mirrors consisting of binary AlN and GaN for increased contrast in the index of refraction. A 99% reflectivity at 467 nm was obtained with one specific structure that employed approximately 20 to 25 pairs of DBR mirrors. A network of cracks was observed which was attributed to the large tensile stress between the two binary compounds. Kim (U.S. Pat. No. 6,306,672, issued on Oct. 23, 2001) describes the formation of DBRs for use in a VCSEL diode where low refractive index air layers are incorporated into the DBR to achieve desired reflectivity. Etching is used to form air layers out of conventional AlGaN or GaN material. These DBRs are utilized in forming a VCSEL diode. Waldrip et al. (Waldrip, K. E., Han, J., Figiel, J. J., Zhou, H., Makarona, E. and Nurmikko, A. V., Appl. Physics Letters, 2001, 78, 22, 3205–3207; incorporated herein by reference) describe the use of interlayers in DBR structures to address the mismatch of the AlGaN/GaN layers and achieve high reflectivity DBR structures without cracks.

DESCRIPTION OF SPECIFIC EMBODIMENTS

Figure 1A:
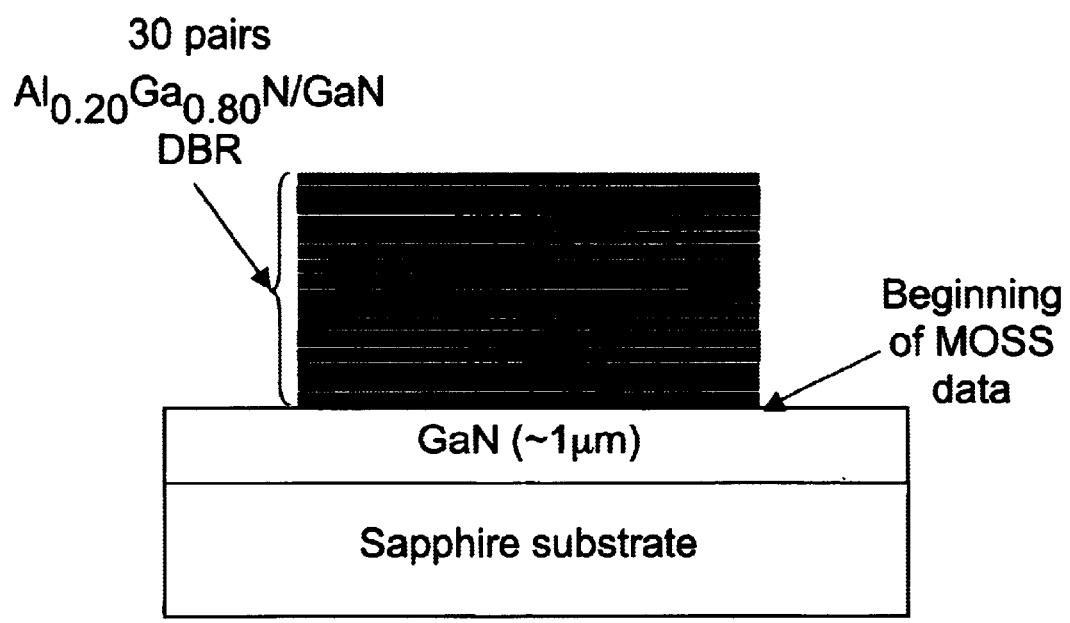
FIG. 1 shows (a) a standard AlGaN/GaN DBR structure grown on a GaN nucleation layer on top of a sapphire substrate and (b) the resulting stress evolution.
Figure 1B:
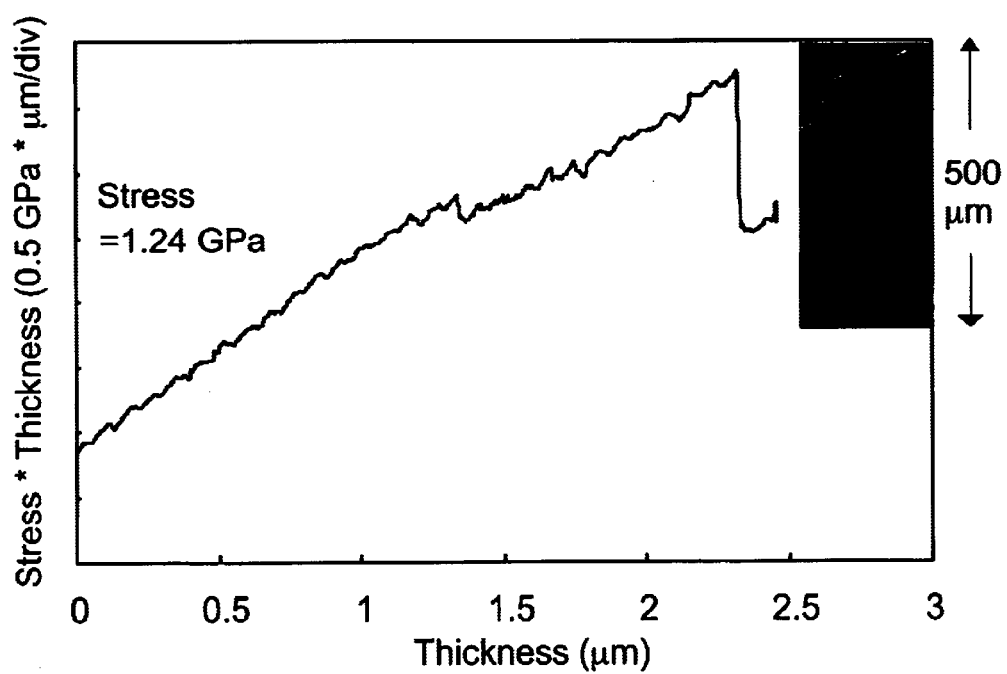

A Distributed Bragg Reflector is formed, comprising AlN or AlGaN interlayers that effectively control mismatch-induced stress and suppress the formation of cracks that otherwise occur during growth of (Al,Ga,B)N/(Al,Ga,B)N epilayers, such as layered AlGaN directly upon GaN. DBRs utilizing AlGaN/GaN layered pairs on a substrate are well known (see FIG. 1a for an example of 30 pairs of $Al_{0.20}Ga_{0.80}N$/GaN on a 1 micron GaN nucleation layer) but have had limited effectiveness with lower reflectivity due to the stresses and crack formation induced by the lattice mismatch in the layers (FIG. 1b shows the in situ tensile stress-thickness developed as a function of thickness with an initial growth stress of 1.24 GPa). The average value of the saw-tooth slope changes is 2.49±0.4 GPa, which agrees reasonably well with the expected tensile stress value of 2.33 GPa based on the elastic mismatch between GaN and $Al_{0.20}Ga_{0.80}N$. Step-like reductions in the stress-thickness trace observed at 1.35 $\mu$m and at 2.33 $\mu$m indicate the relief of tensile stress through crack propagation and admission of dislocations. Inspection of the surface of this DBR under Nomarski microscope confirmed the presence of cracking networks, with an average spacing below 100 $\mu$m.

In the present invention, the employment of at least one interlayer at the beginning of a thick (approximately 5 $\mu$m or more) DBR growth leads to a substantial modification of the initial stress evolution. Tensile growth stress can be brought under control and nearly eliminated, as confirmed by an in-situ stress sensor, through insertion of one or more AlN, AlGaN, or AlN-doped interlayers. Reflectivity (R) values of greater than 0.99 are achieved for wafers greater than two inches in diameter.

In one embodiment of the present invention, a supported DBR structure is formed through a metal-organic vapor phase epitaxy (MOVPE) process wherein a substantially GaN nucleation layer is grown atop a substrate. The substrate can be any standard substrate material used in semiconductor structures, such as sapphire, silicon, silicon carbide, lithium gallate, lithium aluminate, and lithium nitrate. These substrates tend to inherently put the overlaying (Al,Ga,B)N/(Al,Ga,B)N layered structure into tension. The (Al,Ga,B)N/(Al,Ga,B)N layered structure is commonly a AlGaN/GaN structure but can be more generally any Group III material-based structure such as AlBN, GaBN, AlGaN, or AlGaBN material paired with an AlN, GaN, or BN material. Indium can also be substituted. For the present invention, (Al,Ga,B)N/(Al,Ga,B)N represents any of the potential Group III material combinations that can be used. The GaN nucleation layer should be approximately 0.5 microns thick or greater when a sapphire substrate is used.

Figure 2A:
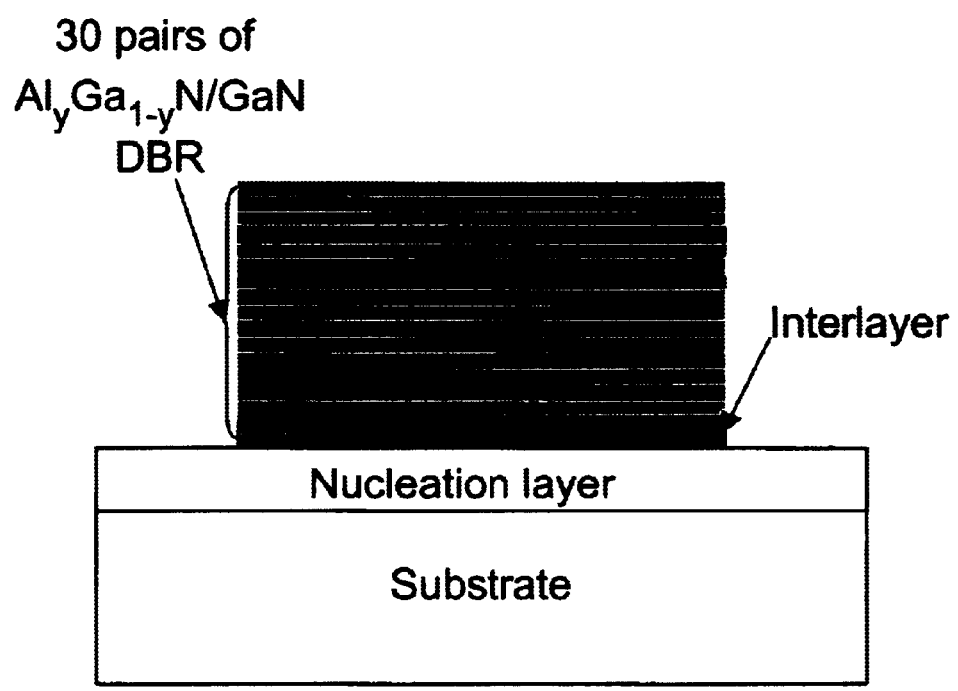
FIG. 2 shows (a) a AlGaN/GaN DBR structure grown on a GaN nucleation layer on top of a sapphire substrate with an interlayer and (b) the resulting stress evolution.
Figure 2B:
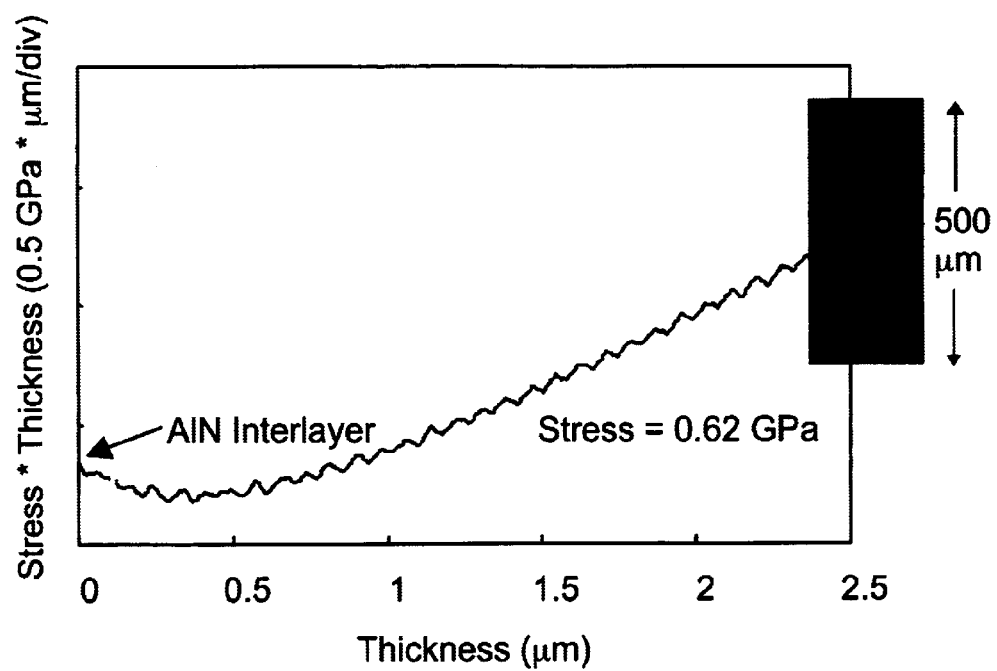

The nucleation layer for any system needs to be thick enough to promote continuous growth. In a standard DBR (Al,Ga,B)N/(Al,Ga,B)N layered structure, pairs of (Al,Ga,B)N/(Al,Ga,B)N layered layers are then epitaxially deposited on the GaN nucleation layer (see FIG. 1a for one embodiment using AlGaN/GaN layers), resulting in high tensile stresses. In the present invention, an interlayer, comprised of a material selected from AlN, $Al_xGa_{1-x}N$ (where 0<x<1), AlBN and doped AlN, $Al_xB_{1-x}N$, or $Al_xGa_{1-x}N$ materials, with a thickness of greater than approximately 20 Angstroms to less than approximately 1000 Angstroms is deposited on the nucleation layer followed by pairs of (Al,Ga,B)N/(Al,Ga,B)N layers, with the relative amounts of the Group III materials present dependent on the desired application. FIG. 2a shows one embodiment using $Al_yGa_{1-y}N$/GaN layers, where again 0<y<1. The inclusion of the interlayer in the structure functions to reduce the tensile stress and even, in the initial several thousand Angstroms, results in a compressive stress in the structure. FIG. 2b shows the resulting stress profile for a 30-pair $Al_{0.20}Ga_{0.80}N$/GaN structure with an AlN (less than 500 Angstroms thick) interlayer deposited on the nucleation layer prior to the AlGaN/GaN pairs. Each $Al_{0.20}Ga_{0.80}N$ and GaN layer is approximately 400 Angstroms thick; the actual thickness can be varied as determined by the desired application. The DBR structure can yield a reflectivity value of greater than 99%.

The interlayer functions by partially relaxing and providing a new lattice template for subsequent layer growth. The amount of relaxation is dependent upon the temperature of deposition, annealing conditions, growth mode, Group V/III ratio, thickness and composition of the interlayer. The dopants in the interlayer can include small amounts, generally less than 1%, of materials such as calcium, zinc, silicon, magnesium, carbon, bismuth, oxygen, antimony, and indium. These dopants can also be present in the (Al,Ga,B)N/(Al,Ga,B)N layered layers. The layers can be formed with or without the use of surfactant agents during growth.

Figure 3A:
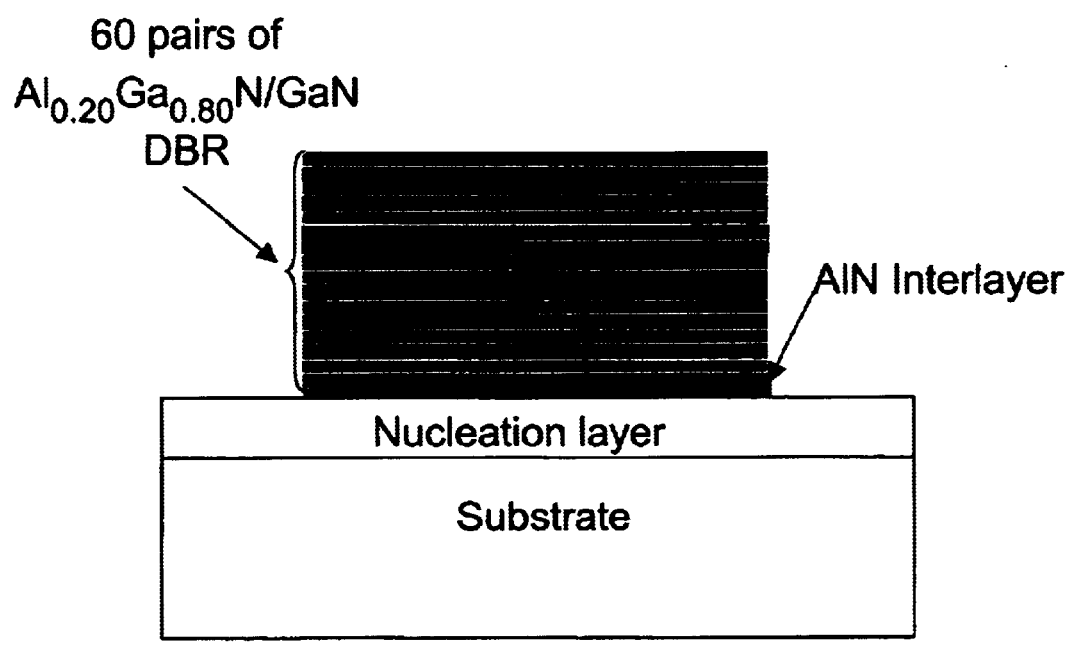
FIG. 3 shows (a) a 60-pair AlGaN/GaN DBR structure grown on a GaN nucleation layer on top of a sapphire substrate with an interlayer and (b) the resulting stress evolution.

In another embodiment, multiple interlayers can be employed in the DBR structure to further eliminate tensile stress. For example, FIG. 3a shows a DBR structure comprising 60 pairs of $Al_yGa_{1-y}N$/GaN layers with an AlN interlayer between every 20 pairs. A nucleation layer, such as comprised of greater than a 0.5 μm-thick GaN material, is deposited on a substrate, such as the sapphire substrate depicted in FIG. 3a, and on the nucleation layer is deposited the first interlayer, where the interlayer can be comprised again of a material selected from AlN, $Al_xGa_{1-x}N$ (where 0<x<1), AlBN and doped AlN, $Al_xB_{1-x}N$, or $Al_xGa_{1-x}N$ materials, with a thickness of greater than approximately 20 Angstroms to less than approximately 1000 Angstroms. On top of the nucleation layer are deposited pairs of $Al_yGa_{1-y}N$/GaN layers. After at least one pair of $Al_yGa_{1-y}N$/GaN layers is deposited, another interlayer can be deposited, onto which additional $Al_yGa_{1-y}N$/GaN layers can be deposited. The frequency of the interlayers in the stack of $Al_yGa_{1-y}N$/GaN pairs depends on the application. The thicknesses of each of the (Al,Ga,B)N/(Al,Ga,B)N layers are also generally greater than approximately 20 Angstroms and less than approximately 1000 Angstroms.

In one embodiment, an AlN interlayer (nominally 150-Å thick) was inserted between the high temperature GaN layer and the DBR structure. FIG. 2b shows the in situ multi-beam optical stress sensor (MOSS) data. The use of an AlN interlayer reduces the in-plane lattice constant and consequently exerts a compressive stress during the initial growth of AlGaN/GaN DBR structures. The observed compressive stress gradually decreases and passes through a stress-free region at around 0.5 μm; a constant tensile stress (approximately 0.62 GPa) is developed and sustained throughout the rest of the DBR growth. The exact origin of the observed stress evolution from compression to tension remains unclear; mechanisms such as grain growth and thin film densification have been invoked in other material systems to explain such a spontaneous occurrence of the tensile stress. In this particular case, the employment of an AlN interlayer delays the occurrence of a tensile stress, reduces the steady-state growth tension, and effectively doubles the critical thickness for cracking. The surface morphology was found to be crack-free over the entire 2-inch wafer. The peak reflectivity, however, only reaches about 78% with a bandwidth of around 12 nm.

Figure 3B:
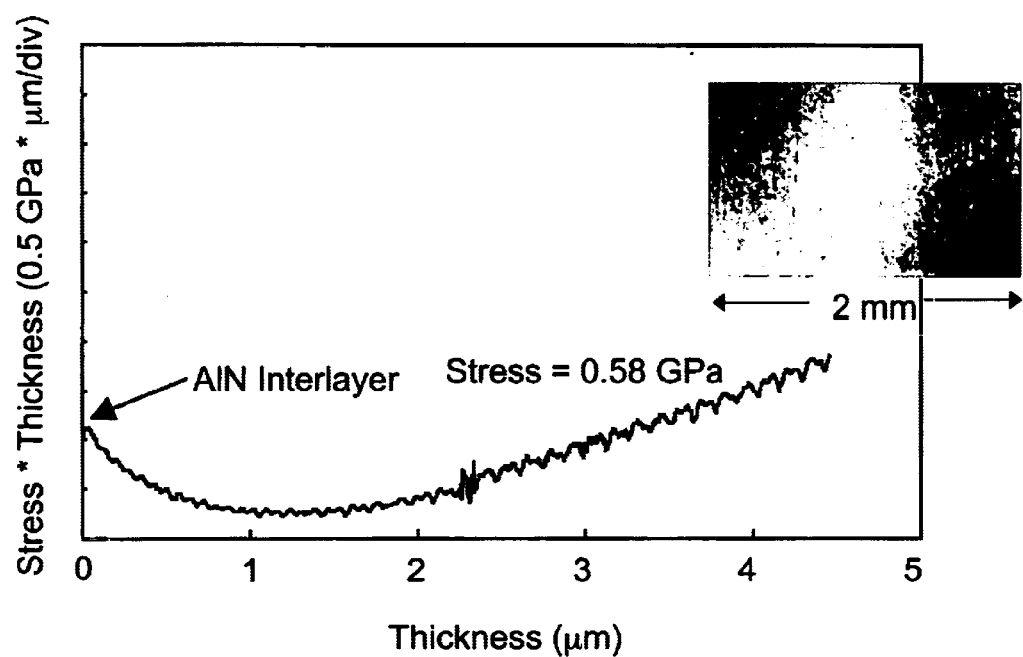

In applying these results to the design and fabrication of an AlGaN/GaN multilayer DBR structure suitable for use in vertical microcavities, modeling based on wave propagation across multiple mediums using the transmission matrix method was performed. The results suggest that 50 to 70 pairs of mirrors are required for a reflectivity exceeding 99% with the use of $Al_{0.20}Ga_{0.80}N$/GaN, due to the small difference in refractive index (Δn~0.08). Another DBR growth was subsequently performed in which the number of pairs was increased to 60 and the same structure was grown on an 150 Å AlN interlayer (see FIG. 3a). In situ MOSS data during the DBR growth are shown in FIG. 3b. Again, the saw-tooth-like fluctuations in (stress)*(thickness) resulting from the growth of the alternating DBR layers are superimposed upon the "background evolution" from compression to tension. The observed growth tension (0.58 GPa) implies a cracking critical thickness of 2 μm, which is less than half of the total thickness. The surface of this sample, which has a total thickness of 5.7 μm (4.7 μm from the DBR and 1.0 μm from the GaN underlying layer), exhibited a low density of cracks with an average spacing varying from 0.5 mm (near the center) to 50 μm (near the edge) of the 2-inch wafer. In-situ stress measurement indicates that it is the accumulation of the background, "dc" tensile stress energy, not the alternating stress fluctuation between the AlGaN and GaN layers, which caused the occurrence of cracking. The corresponding reflectivity spectrum showed a peak reflectivity (λ~378 nm) measured at around 99.1% by a precision reflectometer against a calibrated standard. By varying the individual DBR layer thickness, similar mirrors (R≧0.99) were obtained with a peak wavelength ranging from 375 to 420 nm. High-resolution x-ray diffraction (Θ–2Θ) scan along the (0002) diffraction shows the presence of satellite diffraction peaks up to the $13^{th}$ order.

Figure 4A:
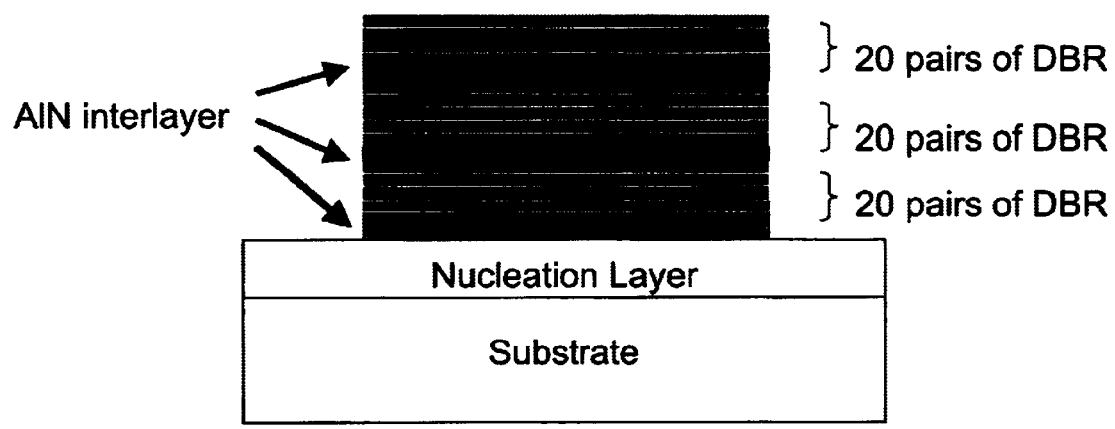
FIG. 4 shows (a) a AlGaN/GaN DBR structure grown on a GaN nucleation layer on top of a sapphire substrate with three interlayers and (b) the resulting stress evolution.
Figure 4B:
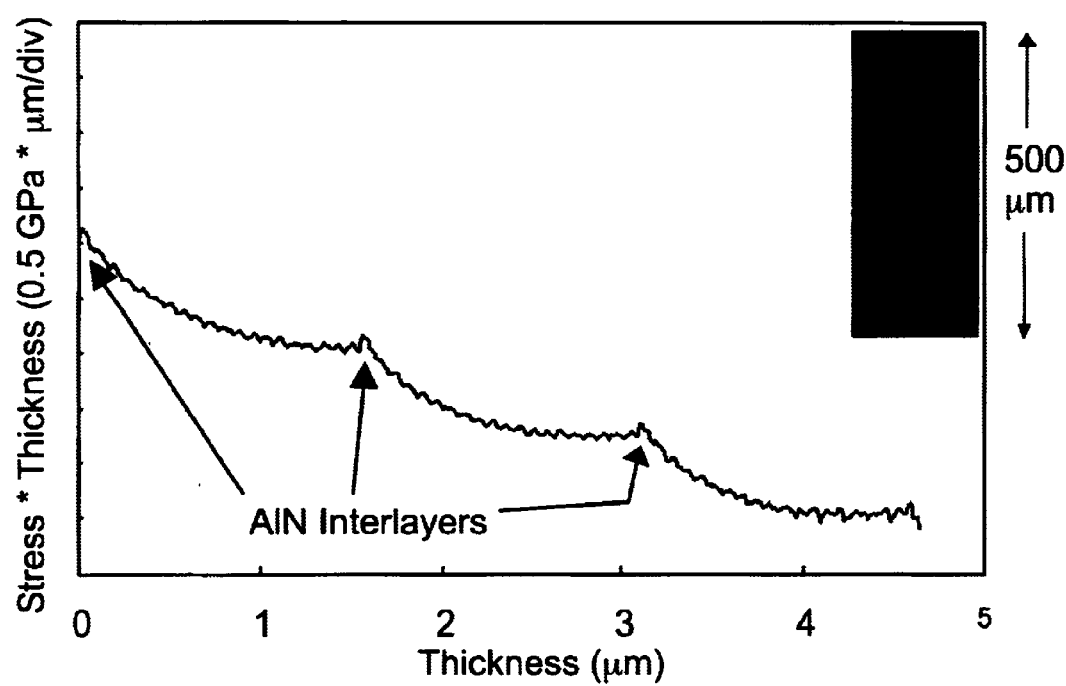

Although low-temperature GaN and AlN multiple-interlayer schemes have been proposed by Amano et al. (Amano, H., Iwaya, M., Hayashi, N., Kashima, T., Katsuragawa, M., Takeuchi, T., Wetzel, C., and Akasaki, I., MRS Internet J. Nitride Semicond. Res. 4S1, G10.1, 1999) for the purpose of dislocation filtering, Benamara et al. (Benamara, M., Liliental-Weber, Z., Mazur, J., Swider, W., Washburn, J., Iwaya, M., Akasaki, I., and Amano, H., MRS Internet J. Nitride Semicond. Res. 5S1, W5.8, 2000) found that the use of AlN multiple interlayers tended to increase the density of edge-type dislocations through dislocation multiplication. In the present invention, a 60-pair $Al_{0.20}Ga_{0.80}N$/GaN DBR structure was grown in which an AlN interlayer was inserted after every growth of 20 pairs (see FIG. 4a, where a total of three AlN interlayers was employed). It is generally expected that at least five pairs of AlGaN/GaN layers should be deposited before growth of another interlayer. The in-situ stress-thickness vs. thickness of the multiple interlayer DBR is presented FIG. 4b. Once again, the sawtooth-like features of alternating stress are observed due to the elastic strain between GaN and AlGaN layers. Nevertheless, a distinct "drape-like" stress evolution is observed in which the instantaneous growth stress was substantially modified after each introduction of the AlN interlayer. For this particular sample, a compressive stress of 2.3 GPa is introduced after every AlN interlayer. Tensile stress was not observed in any of the 5 µm DBR region, in contrast to the samples with no or only one AlN interlayer. HRXRD was employed to assess the structural quality of the 60-pair DBR with multiple interlayers. When compared with the HRXRD data for a 60-pair $Al_{0.2}Ga_{0.80}N/GaN$ with a single AlN interlayer, it appears that the introduction of the three AlN interlayers in a similar structure does not significantly change the microstructural quality. No cracks were observed under Nomarski microscope (50 to 500 times magnification) over the entire two-inch wafer (approximately 5.7 µm-thick film), and the peak of reflectivity remains above 99%, with a bandwidth of 13 nm.

With a DBR so structured, crack-free growth of multiple (60) pairs of $Al_{0.20}Ga_{0.20}N/GaN$ DBR mirrors has been achieved over the entire two-inch wafer with a maximum reflectivity of at least 99%. By incorporating the in-situ DBRs as bottom mirrors to vertical cavity structures that include AlGaN/InGaN multiple quantum well active media and dielectric DBRs as top mirrors, room temperature optically-pumped VCSEL operation at 384 nm has also been demonstrated.

In the formation of the DBR structures of the present invention, metal-organic vapor phase epitaxy was conducted in a vertical rotating-disc reactor. Standard GaN templates were prepared using a two-step nucleation procedure on sapphire. The AlGaN/GaN quarter-wavelength DBRs and the interlayers were grown at 40 Torr at 1050° C. Ammonia and H$_2$ flows were set at 2.5 and 5 l/min, respectively. Trimethylgallium (TMG) and trimethylaluminum (TMA) were employed as metal-organic precursors. Growth rates of the AlGaN and GaN layers were calibrated in-situ using optical reflectometry (from the period of the Fabry-Perot interference fringes) immediately prior to the growth of DBRs.

High-resolution x-ray diffractometry (HRXRD) was performed using a Philips X'Pert System. Real time in-situ stress monitoring based on wafer curvature measurements was performed with a multi-beam optical stress sensor (MOSS) modified for use on our reactor. To determine the wafer curvature, the divergence of multiple initially parallel laser beams is measured on a CCD camera after reflection of the beams from the film/substrate surface. Changes in wafer curvature induce a proportional change in the beam spacing on the camera. This technique provides a direct measurement of the stress-thickness product during MOVPE of GaN. Slopes of the (stress)(thickness) traces versus time during deposition cycles can be converted to instantaneous stress once the time scale is converted to thickness scale using growth rates derived from in-situ reflectance measurements.

In another embodiment, interlayers can generally be inserted in any (Al,Ga,B)N/(Al,Ga,B)N layered or doped structure, such as a superlattice structure, to reduce tensile stress and cracking tendency of such a structure. As with the previously described embodiments, the interlayers can be comprised of a material selected from AlN, BN, (Al,Ga,B) N, and such doped materials, with a thickness of greater than approximately 20 Angstroms to less than approximately 1000 Angstroms. Since the function of the interlayer is to relax, thereby providing a new lattice template for subsequent growth, interlayers may be employed to provide a new substrate material for subsequent growth of materials or devices at a new lattice constant to reduce or induce tensile or compressive strain in the system.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A supported distributed Bragg reflector, comprising:
a substrate;
a nucleation layer deposited on said substrate, said nucleation layer being of sufficient thickness to promote contiguous growth of subsequent deposited layers:
an interlayer deposited on said nucleation layer, said interlayer controlling mismatch-induced stress and suppressing formation of cracks and said interlayer comprising a material selected from AlN, $Al_yGa_{1-y}N$, and $Al_yB_{1-y}N$, where $0<y<1$; and
multiple pairs of $(Al_wGa_xB_{1-w-x}N/Al_{w'}Ga_{x'}B_{1-w'-x'}N$ layers, where $0 \leq w \leq 1, 0 \leq x \leq 1, 0 \leq w' \leq 1, 0 \leq x' \leq 1$, deposited on said interlayer, thereby forming a supported distributed Bragg reflector.

2. The supported distributed Bragg reflector of claim 1 further comprising an interlayer deposited between two of said multiple pairs of $(Al_wGa_xB_{1-w-x}N/Al_{w'}Ga_{x'}B_{1-w'-x'}N)$ layers.

3. The supported distributed Bragg reflector of claim 1 wherein said substrate comprises a material selected from sapphire, silicon, silicon carbide, lithium gallate, lithium aluminate, and lithium nitrate.

4. The supported distributed Bragg reflector of claim 1 wherein said nucleation layer comprises a GaN material.

5. The supported distributed Bragg reflector of claim 4 wherein said nucleation layer has a thickness greater than approximately 0.5 microns.

6. The supported distributed Bragg reflector of claim 1 wherein said interlayer has a thickness greater than approximately 20 Angstroms and less than approximately 1000 Angstroms.

7. The supported distributed Bragg reflector of claim 1 wherein said pairs of $(Al_wGa_xB_{1-w-x}N/Al_{w'}Ga_{x'}B_{1-w'-x'}N)$ layers comprise layers each with a $Al_wGa_xB_{1-w-x}N$ layer with a thickness of greater than approximately 20 Angstroms and less than approximately 1000 Angstroms and a $Al_{w'}Ga_{x'}B_{1-w'-x'}N$ layer of greater than approximately 20 Angstroms and less than approximately 1000 Angstroms.

8. The supported distributed Bragg reflector of claim 1 wherein said interlayer material further comprises a dopant, said dopant selected from less than approximately 1% by weight of calcium, zinc, silicon, magnesium, carbon, bismuth, oxygen, antimony, and indium.

9. The supported distributed Bragg reflector of claim 1 wherein said pairs of $(Al_wGa_xB_{1-w-x}N/Al_{w'}Ga_{x'}B_{1-w'-x'}N)$ layers comprise $Al_yGa_{1-y}N/GaN$ layers, where $0<y<1$.

10. The supported distributed Bragg reflector of claim 9 wherein said multiple pairs of $Al_yGa_{1-y}N/GaN$ layers number more than 50 pairs and less than 70 pairs, wherein at least one additional interlayer is interspersed between said multiple pairs of $Al_yGa_{1-y}N/GaN$ layers.

11. The supported distributed Bragg reflector of claim 10 wherein the distributed Bragg reflector has a reflectivity value greater than 0.99.

12. The supported distributed Bragg reflector of claim 1 wherein said interlayer results in an Initial compressive growth stress.

13. A supported distributed Bragg reflector, comprising:

a substrate;

a GaN nucleation layer deposited on said substrate, said GaN nucleation layer having a thickness greater than approximately 0.5 microns;

a first interlayer deposited on said nucleation layer, said first interlayer controlling mismatch-induced stress and suppressing formation of cracks and comprising a material selected from, AlN, $Al_xGa_{1-x}N$, and $Al_xB_{1-x}N$, where $0<x<1$;

at least five pairs of $Al_yGa_{1-y}N$/GaN layers, where $0<y<1$, deposited on said interlayer;

a second Interlayer deposited on said $Al_yGa_{1-y}N$/GaN layers, said second interlayer controlling mismatch-induced stress and suppressing formation of cracks and composing a material selected from AlN, $Al_xGa_{1-x}N$, and $Al_xB_{1-x}N$, where $0<x<1$; and multiple pairs of $(Al_wGa_xB_{1-w-x}N/Al_{w'}Ga_{x'}B_{1-w'-x'}N)$ layers, where $0 \leq w \leq 1, 0 \leq x \leq 1, 0 \leq w' \leq 1, 0 \leq x' \leq 1$, deposited on said interlayer, thereby forming a supported distributed Bragg reflector.

14. A supported semiconductor lattice structure, comprising:

a substrate, said substrate comprising a material selected from sapphire, silicon, silicon carbide, lithium gallate, lithium aluminate, and lithium nitrate;

a nucleation layer deposited on said substrate, said nucleation layer being of sufficient thickness to promote continuous growth of subsequent deposited layers;

an interlayer deposited on said nucleation layer, said interlayer controlling mismatch-induced stress and suppress formation of cracks and comprising a material selected from an $Al_wGa_xB_{1-w-x}N$ material, where $0 \leq w \leq 1, 0 \leq x \leq 1$, said interlayer having a thickness greater than approximately 20 Angstroms and less than approximately 1000 Angstroms; and a layer of $Al_{w'}Ga_{x'}B_{1-w'-x'}N$, where $0 \leq w' \leq 1, 0 \leq x \leq x' \leq 1$, material deposited on said interlayer.

* * * * *